(12) United States Patent
Dudemaine et al.

(10) Patent No.: US 9,320,160 B2
(45) Date of Patent: Apr. 19, 2016

(54) SMALL FORM-FACTOR PLUGGABLE UNIT HAVING A PLURALITY OF INSERTABLE CAGES

(71) Applicant: EMBRIONIX DESIGN INC, Laval (CA)

(72) Inventors: Eric Dudemaine, Crabtree (CA); Renaud Lavoie, Laval (CA)

(73) Assignee: EMBRIONIX DESIGN INC., Laval (CA)

( * ) Notice: Subject to any disclaimer, the term of this patent is extended or adjusted under 35 U.S.C. 154(b) by 305 days.

(21) Appl. No.: 13/745,907

(22) Filed: Jan. 21, 2013

(65) Prior Publication Data
US 2013/0217256 A1 Aug. 22, 2013

Related U.S. Application Data

(60) Provisional application No. 61/588,789, filed on Jan. 20, 2012.

(51) Int. Cl.

| | |
|---|---|
| H05K 7/00 | (2006.01) |
| G02B 6/38 | (2006.01) |
| G02B 6/36 | (2006.01) |
| H05K 7/10 | (2006.01) |
| H01R 13/627 | (2006.01) |
| H05K 5/02 | (2006.01) |
| H01R 13/46 | (2006.01) |
| H05K 7/20 | (2006.01) |
| G02B 6/42 | (2006.01) |
| H04N 5/64 | (2006.01) |
| H04L 12/931 | (2013.01) |
| H05K 7/02 | (2006.01) |

(52) U.S. Cl.
CPC ............... *H05K 5/0217* (2013.01); *G02B 6/36* (2013.01); *G02B 6/4261* (2013.01); *H01R 13/46* (2013.01); *H04L 49/40* (2013.01); *H04N 5/64* (2013.01); *H05K 7/20* (2013.01); *G02B 6/4284* (2013.01); *H05K 7/02* (2013.01)

(58) Field of Classification Search
CPC ......... H05K 7/02; H05K 5/0217; G02B 6/36; G02B 6/38; H01R 9/05; H01R 24/00; H01R 13/46; G06F 13/00
USPC .......... 361/726, 729, 788; 385/53, 75, 76, 92; 439/352, 607; 710/302
See application file for complete search history.

(56) References Cited

U.S. PATENT DOCUMENTS

| | | | |
|---|---|---|---|
| 6,742,068 B2 * | 5/2004 | Gallagher et al. ............ 710/302 |
| 2002/0021558 A1 | 2/2002 | Schwarz et al. | |
| 2002/0150344 A1 * | 10/2002 | Chiu et al. ...................... 385/53 |
| 2004/0077217 A1 | 4/2004 | Hwang | |
| 2008/0069501 A1 * | 3/2008 | Mudd et al. ...................... 385/75 |
| 2009/0016685 A1 | 1/2009 | Hudgins et al. | |
| 2011/0249944 A1 | 10/2011 | Lavoie et al. | |

* cited by examiner

*Primary Examiner* — Courtney Smith
*Assistant Examiner* — Zhengfu Feng

(57) ABSTRACT

A multicage small form-factor pluggable (SFP) unit comprises a front portion, and a plurality of cages mounted to a rearward side of the front portion. An actuator may emerge from the front portion, for disengaging the plurality of cages from a chassis upon upward movement of the actuator. One or more external connectors may be mounted to a front panel of the front portion. One or more rear connectors may be mounted to a back panel of at least one of the cages, for connecting to a backplane. At least one of the cages may comprise one or more processing modules. Various combinations of internal connections may be implemented between the external connectors if any, the rear connectors if any, and the processing modules if any. The multicage SFP unit may for example comprise two, three or four cages arranged in a horizontal row.

17 Claims, 18 Drawing Sheets

001
SMALL FORM-FACTOR PLUGGABLE UNIT HAVING A PLURALITY OF INSERTABLE CAGES

TECHNICAL FIELD

The present disclosure relates to the field of small form-factor pluggable units. More specifically, the present disclosure relates to a small form-factor pluggable unit having a plurality of insertable cages.

BACKGROUND

Small Form-factor Pluggable (SFP) units are standardized units adapted to be inserted within a chassis. A specification developed according to a multi-source agreement (MSA) involving a plurality of equipment vendors provides a mechanical specification describing the size of the SFP unit, so as to ensure that all SFP fully-compliant and partially-compliant units may be inserted smoothly within one same chassis, i.e. inside cages, ganged cages, stacked cages and belly-to-belly cages. Additionally, the MSA specification provides an electrical interface specification for internal rear connectors allowing exchange of signals and data between rear connectors of SFP units and various components in a chassis backplane.

SFP units may be designed with various types of external connectors, such as coaxial connectors, optical connectors, and any other type of electrical connector.

SFP units are small in dimensions. Traditionally, SFP units were essentially passive and their main function was to allow interconnection between external active components, connected to SFP external connectors and active components of a chassis in which the SFP units were inserted.

Recently introduced SFP units comprise active components capable of processing data and signals received at their front or rear connectors. These improved SFP units provide a wide new range of possibilities for integration and miniaturization of data and signal processing features. However, the small size of standard SFP units may limit those possibilities since their front panels may only support a small size of external connectors, while their small internal size provides limited room for integrating processing modules.

Therefore, there is a need for new techniques allowing connection of an increased number of connectors and/or integration of an increased number of processing modules within SFP units.

SUMMARY

According to a first aspect, the present disclosure provides a multicage small form-factor pluggable (SFP) unit. The multicage SFP unit comprises a front portion, and a plurality of cages mounted to a rearward side of the front portion.

According to a second aspect, the multicage SFP unit further comprises latches positioned underneath each one of the plurality of cages for maintaining the plurality of cages within a chassis, levers adjacent to each of the latches, and an actuator emerging from the front portion and operably connected to the levers. Upon upward movement of the actuator, the latches apply pressure underneath the plurality of cages, thereby disengaging the plurality of cages from the chassis.

According to a third aspect, one or more latches (and corresponding levers) are positioned underneath one or more of the plurality of cages respectively, but not underneath each one of the plurality of cages.

According to a fourth aspect, the multicage SFP unit further comprises at least one connector. The at least one connector may consist of one of: an external connector mounted to a front panel of the front portion; and a rear connector mounted on one of the cages, at an opposite end from the front portion, and capable of connecting to a backplane.

According to a fifth aspect, the multicage SFP unit comprises at least one external connector mounted to the front panel. The multicage SFP unit may further comprise at least one rear connector mounted on at least one of the cages and/or at least one processing module in at least one of the cages.

According to a sixth aspect, the multicage SFP unit comprises at least one rear connector mounted on at least one of the cages. The multicage SFP unit may further comprise at least one external connector mounted on the front panel and/or at least one processing module in at least one of the cages.

According to a seventh aspect, various combinations of internal connections may be implemented between the external connectors if any, the rear connectors if any, and the processing modules if any, of a multicage SFP unit.

According to an eighth aspect, an internal connection of two processing modules located in two distinct cages passes through the front portion of the multicage SFP unit.

BRIEF DESCRIPTION OF THE DRAWINGS

Embodiments of the disclosure will be described by way of example only with reference to the accompanying drawings, in which.

DETAILED DESCRIPTION

Figure 1:
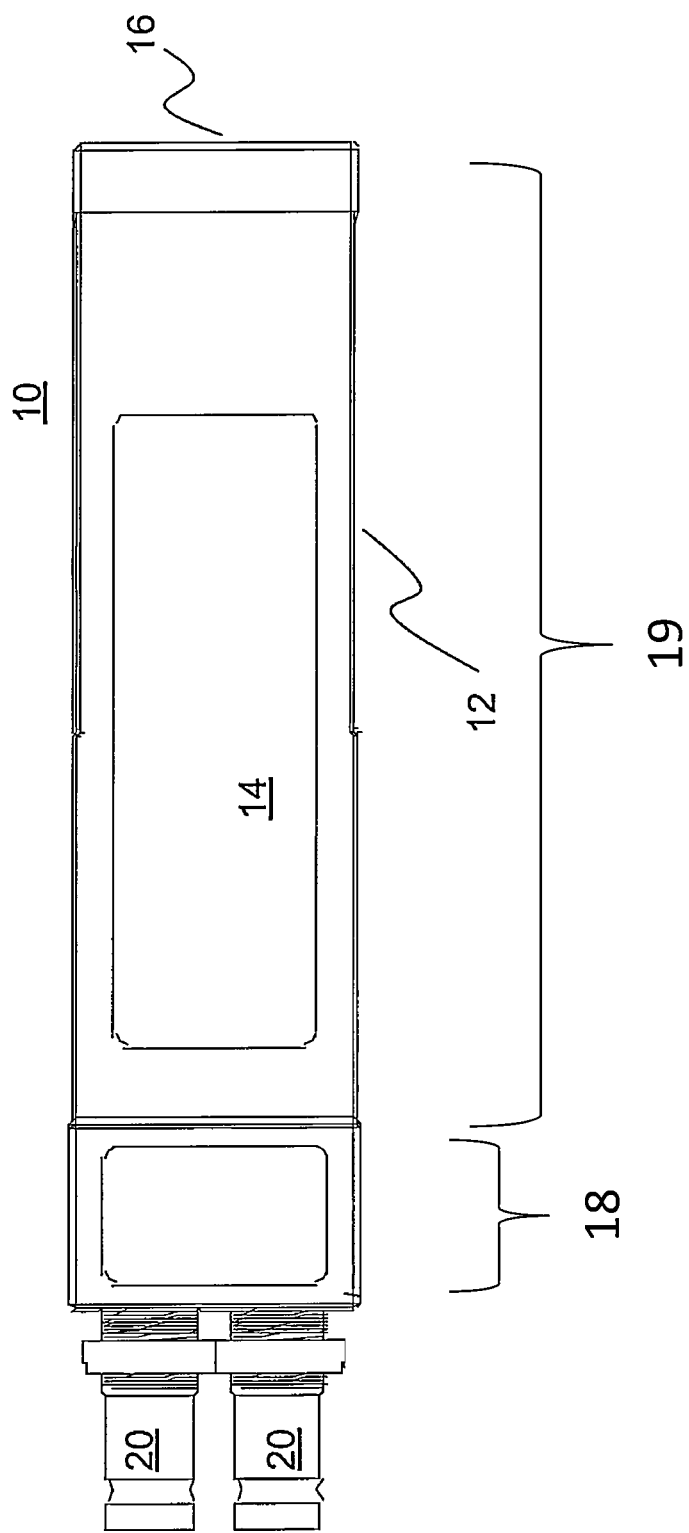
FIG. 1 is a top view of a single cage SFP unit.
Figure 2:
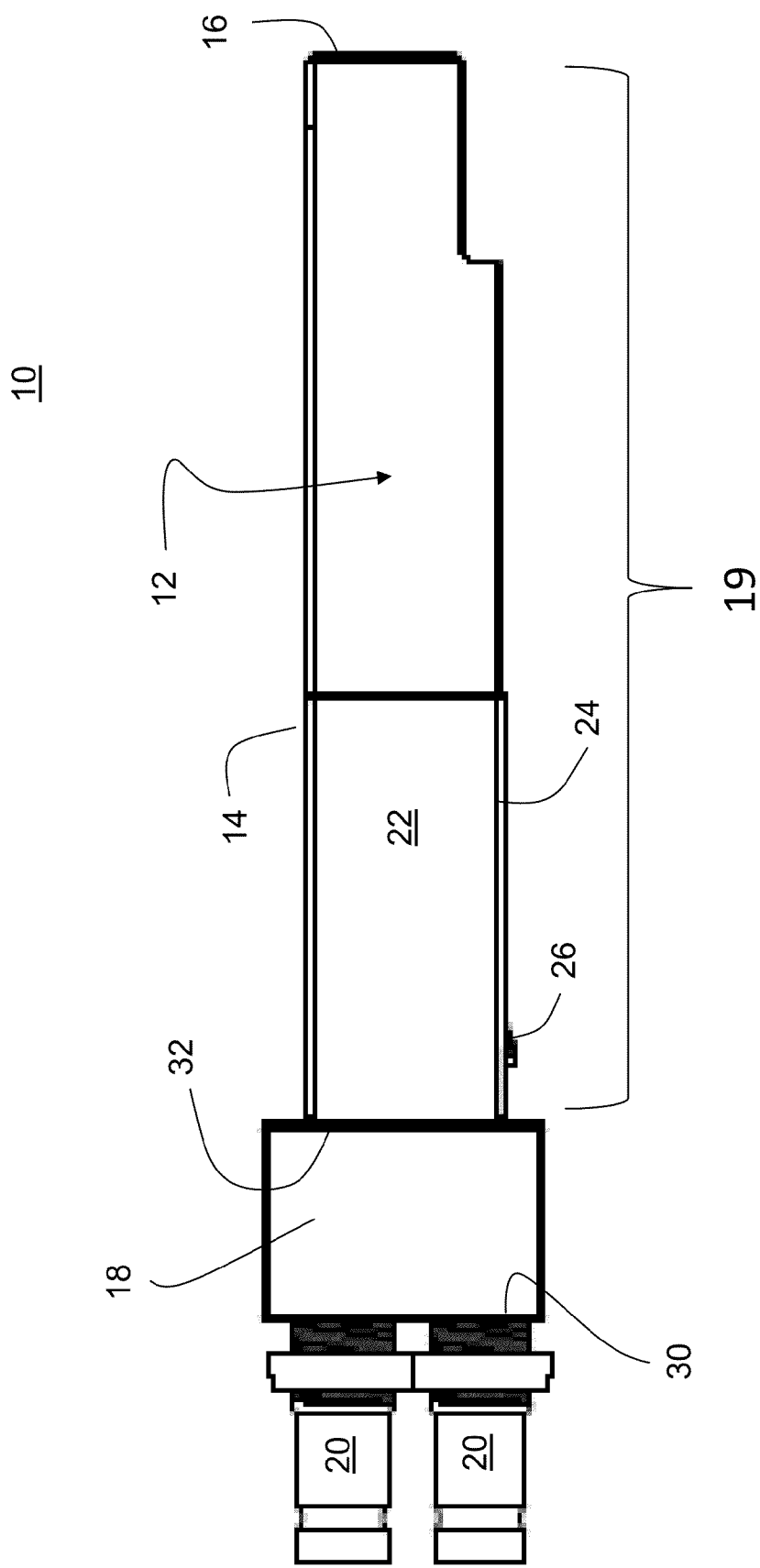
FIG. 2 is a side elevation view of the single cage SFP unit of FIG. 1.
Figure 4:
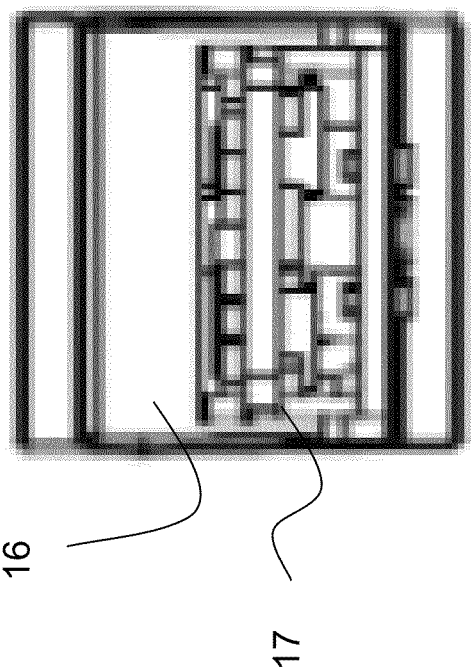
FIG. 4 is back elevation view of the single cage SFP unit of FIG. 1.
Figure 3:
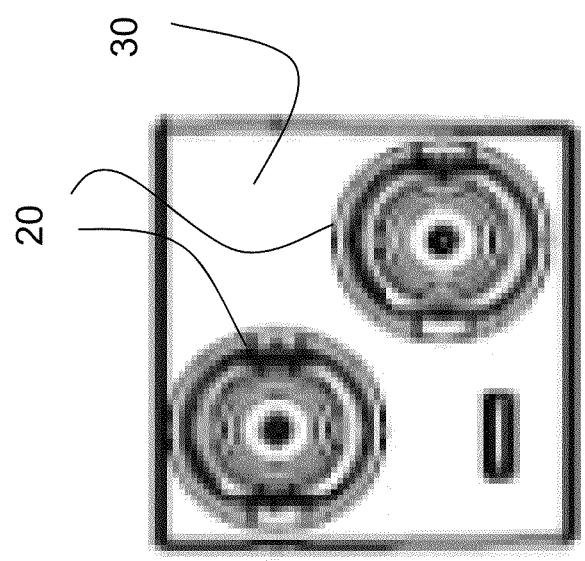
FIG. 3 is a front elevation view of the single cage SFP unit of FIG. 1.
Figure 5:
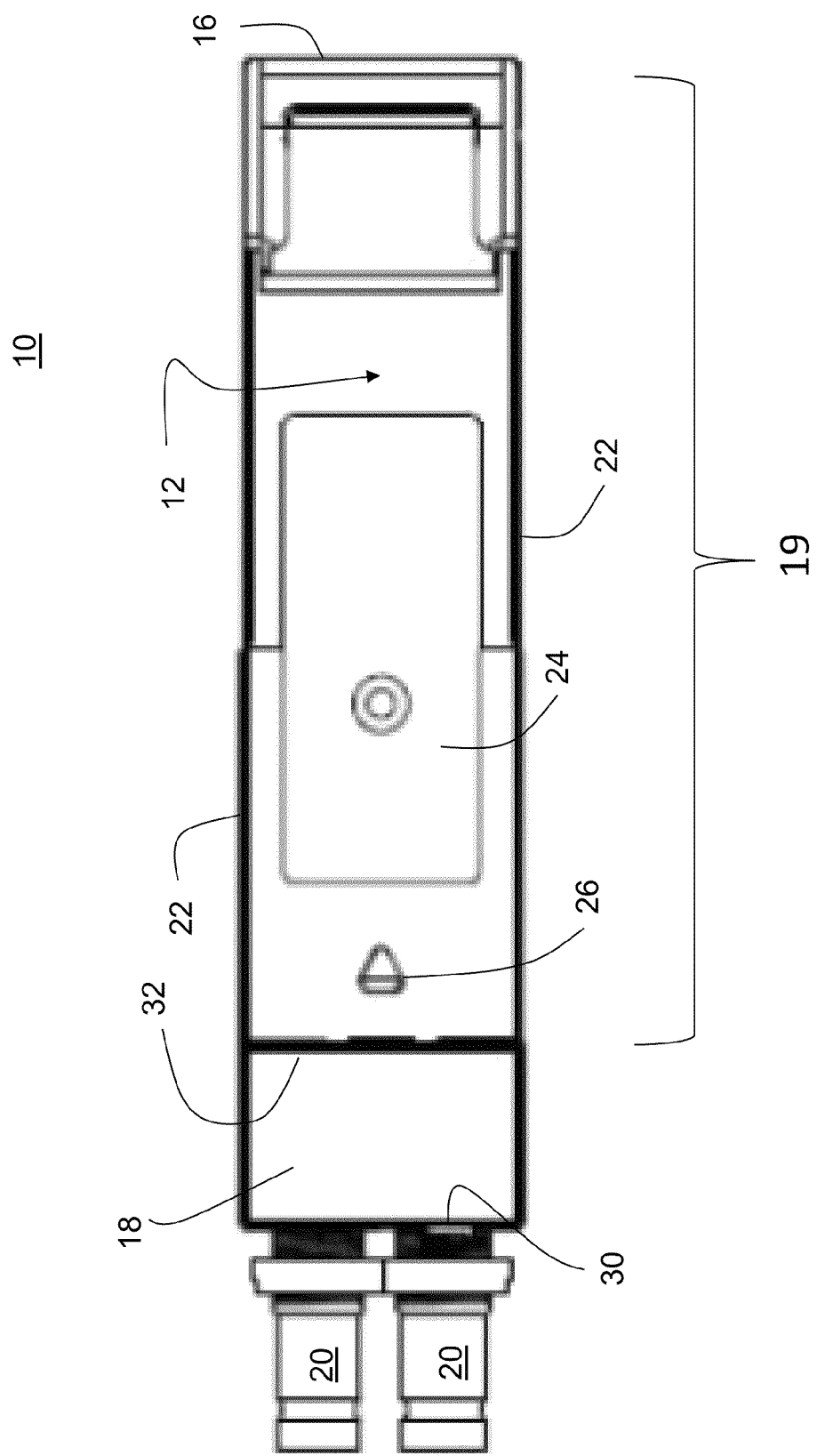
FIG. 5 is a bottom view of the single cage SFP unit of FIG. 1.

The foregoing and other features will become more apparent upon reading of the following non-restrictive description of illustrative embodiments thereof, given by way of example only with reference to the accompanying drawings. Like numerals represent like features on the various drawings.

Various aspects of the present disclosure generally address one or more of the problems related to connection of an increased number of connectors and to integration of an increased number of processing modules within SFP units.

TERMINOLOGY

The following terminology is used throughout the present disclosure:

Small form-factor pluggable (SFP) unit: a component intended for insertion, at least in part, into a chassis, having mechanical and electrical characteristics according to one or more of SFP, SFP+ or XFP specifications.

Front portion: a part of a SFP unit that remains outside of a chassis when the SFP unit is inserted.

Front panel: a forward face of a front portion of a SFP unit.

Cage: an exterior shell of a SFP unit that is insertable into a chassis.

Back panel: a backward face of a cage, at an opposite end of a front portion of a SFP unit.

Chassis: a supporting frame adapted for receiving SFP units.

Backplane: an internal component of a chassis, for connecting to rear connectors of SFP units.

Connector: an electro-mechanical or optical-mechanical device for attaching a link capable of sending and/or receiving data or signals.

External connector: a connector mounted to a front panel of a front portion of a SFP unit, capable of sending and/or receiving data or signals between the SFP unit and another device.

Rear connector: a connector mounted to a back panel of a SFP unit for connecting to a backplane of a chassis, capable of sending and/or receiving data or signals between the SFP unit and components of the chassis.

Processing module: an internal component of a SFP unit, capable of processing data or signals, including but not limited to receiving, generating, transmitting, forwarding or altering data or signals.

Internal connection: a link between components of a SFP unit, for example between two connectors, between two processing modules, between a processing module and a connector, and the like.

Actuator: a mechanical device that may be manipulated for exerting a motion on another element.

Latch: a movable mechanical fastener.

SFP: in the context of the present disclosure, "SFP" designates a Small Form-factor Pluggable Unit corresponding to SFP, SFP+ and/or XFP specifications, or to any other related specification.

The present disclosure relates to small form-factor pluggable unit having a plurality of insertable cages. A multicage SFP unit comprises a front portion, and a plurality of cages mounted to a rearward side of the front portion. The multicage SFP unit may further comprise additional functional entities, as will be detailed later in the description.

Single Cage SFP Unit

Reference is now made concurrently to FIGS. 1-5, which are, respectively, a top view, a side elevation view, a front elevation view, a back elevation view and a bottom view of a single cage SFP unit 10. The single cage SFP unit 10 comprises a housing 12. The housing 12 generally comprises two main sections, including a front portion 18 and a cage 19. The cage 19 is attached to a rearward side 32 of the front portion 18 and defines a top 14, a bottom 24, and two sides 22. The housing 12 is at least partially of dimensions in compliance with the SFP, SFP+ and/or XFP specifications or having functional dimensions based on the SFP, SFP+ and/or XFP specifications.

The single cage SFP unit 10 further comprises a back panel 16 affixed to the housing 12. The back panel 16 may comprise one or more connectors 17, for example electrical or optical connectors. In an example, the back panel comprises a connector suitable to connect the single cage SFP unit 10 to a backplane of a chassis (not shown for clarity purposes), as known to those skilled in the art.

One or more connectors, for example co-axial connectors 20 adapted to send and/or receive radio frequency (RF) signals, may be connected to a front panel 30 of the front portion 18, for connecting the single cage SFP unit 10 to external devices. The single cage SFP unit 10 may further comprise an engagement mechanism such as for example a latch 26 as shown in a resting position on the bottom 24, for maintaining the single cage SFP unit 10 in place within a chassis.

Although not shown, the single cage SFP unit 10 may further comprise a receiver, a transmitter and/or a transceiver. The single cage SFP unit 10 may alternately comprise dual receivers and/or dual transmitter, a data processor, a signal processor, and the like. Each connector of the single cage SFP unit 10 may be connected to a receiver, a transmitter, a transceiver or a processor.

Multicage SFP Unit

A multicage SFP unit comprises a front portion, and a plurality of cages mounted to a rearward side of the front portion. The number of cages may be any number higher or equal to two; for instance two, three, or four cages. In a preferred embodiment, each one of the plurality of cages is dimensioned according to a SFP, SFP+ or XFP specification. However, some variations with respect to these specifications may be implemented, in order to accommodate particular configurations of the multicage SPF unit. In a preferred embodiment, the plurality of cages is arranged in a horizontal row. In an alternative embodiment, the plurality of cages may be arranged in a vertical row.

Figure 6:
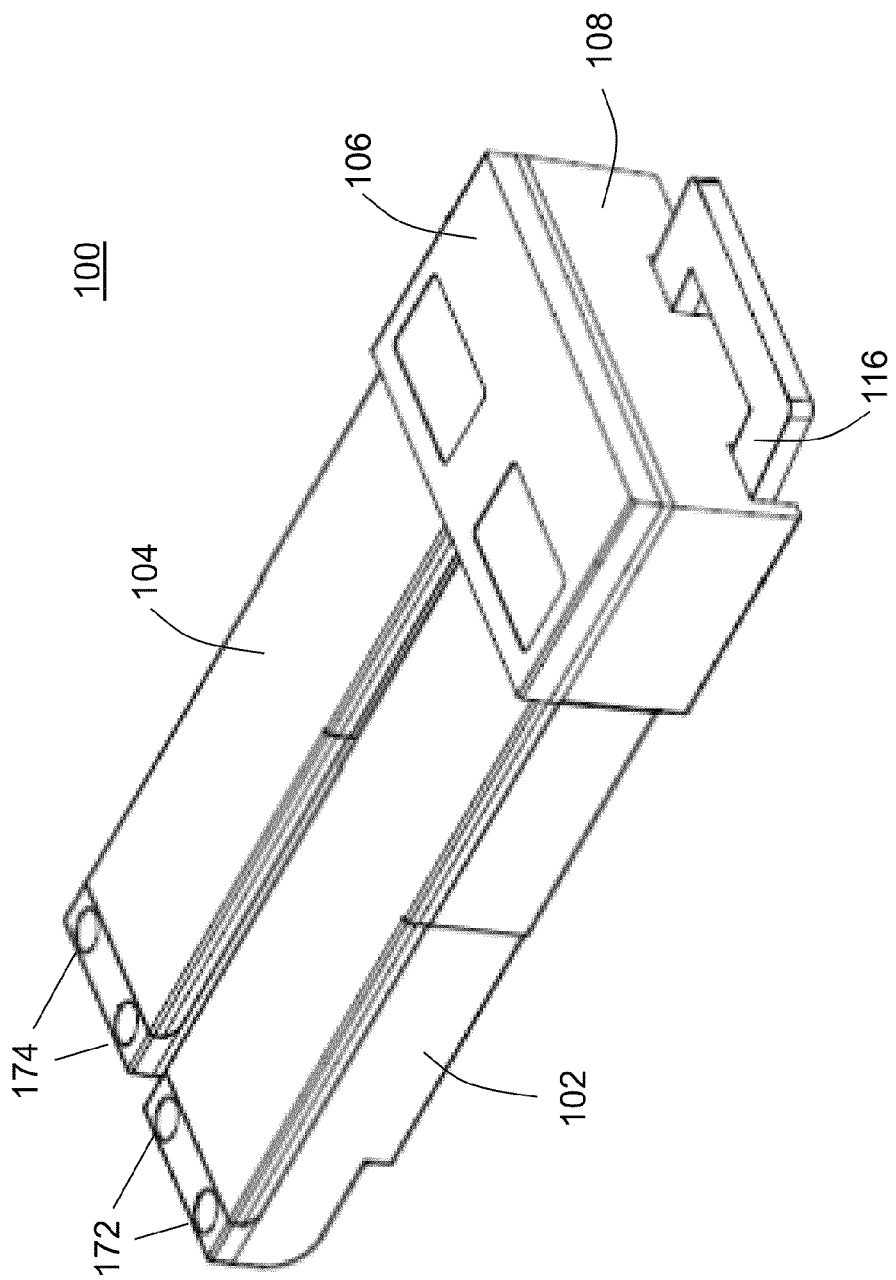
FIG. 6 is a perspective view of a multicage SFP unit having two cages, according to an embodiment.
Figure 7:
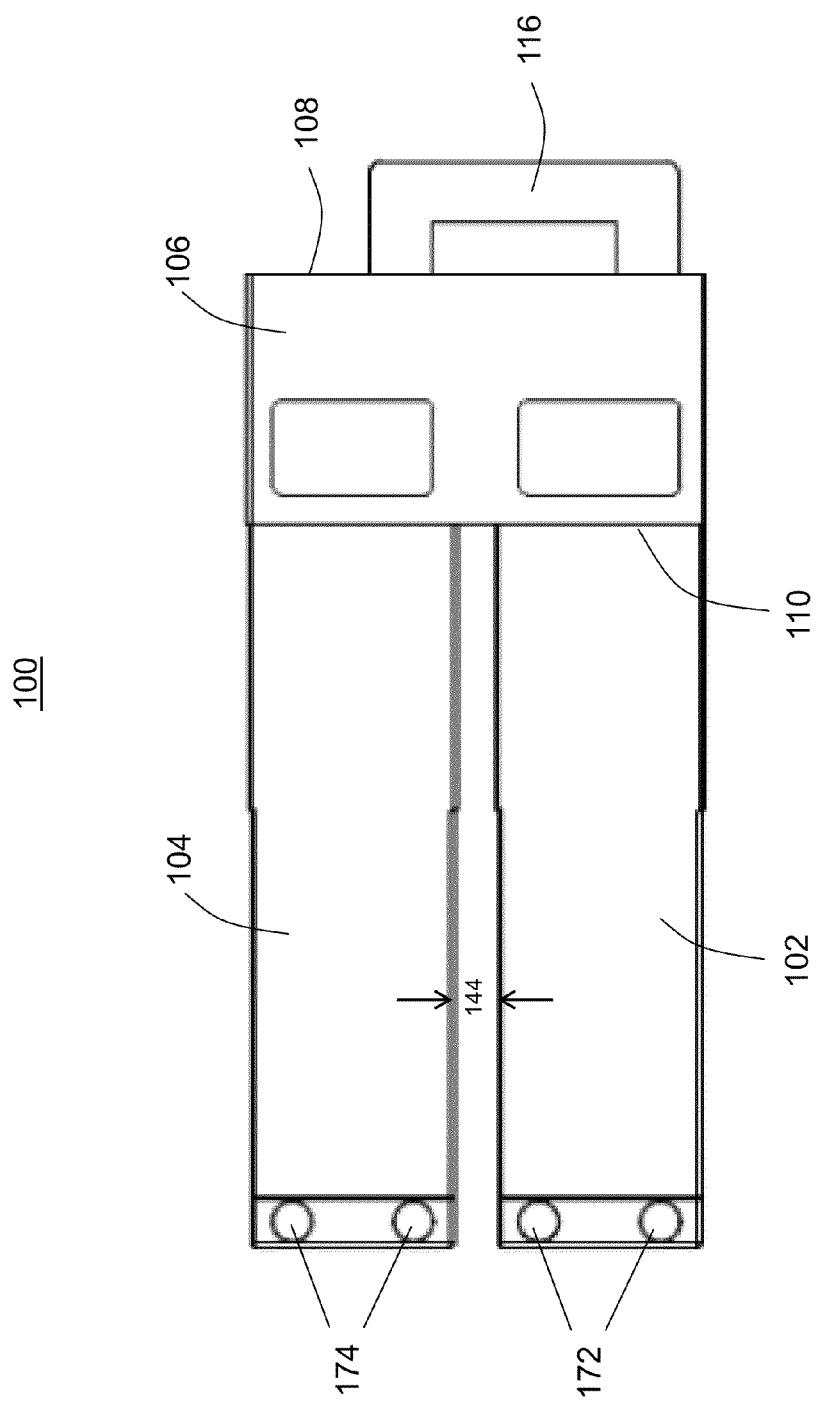
FIG. 7 is a top plan view of the multicage SFP unit of FIG. 6.
Figure 8:
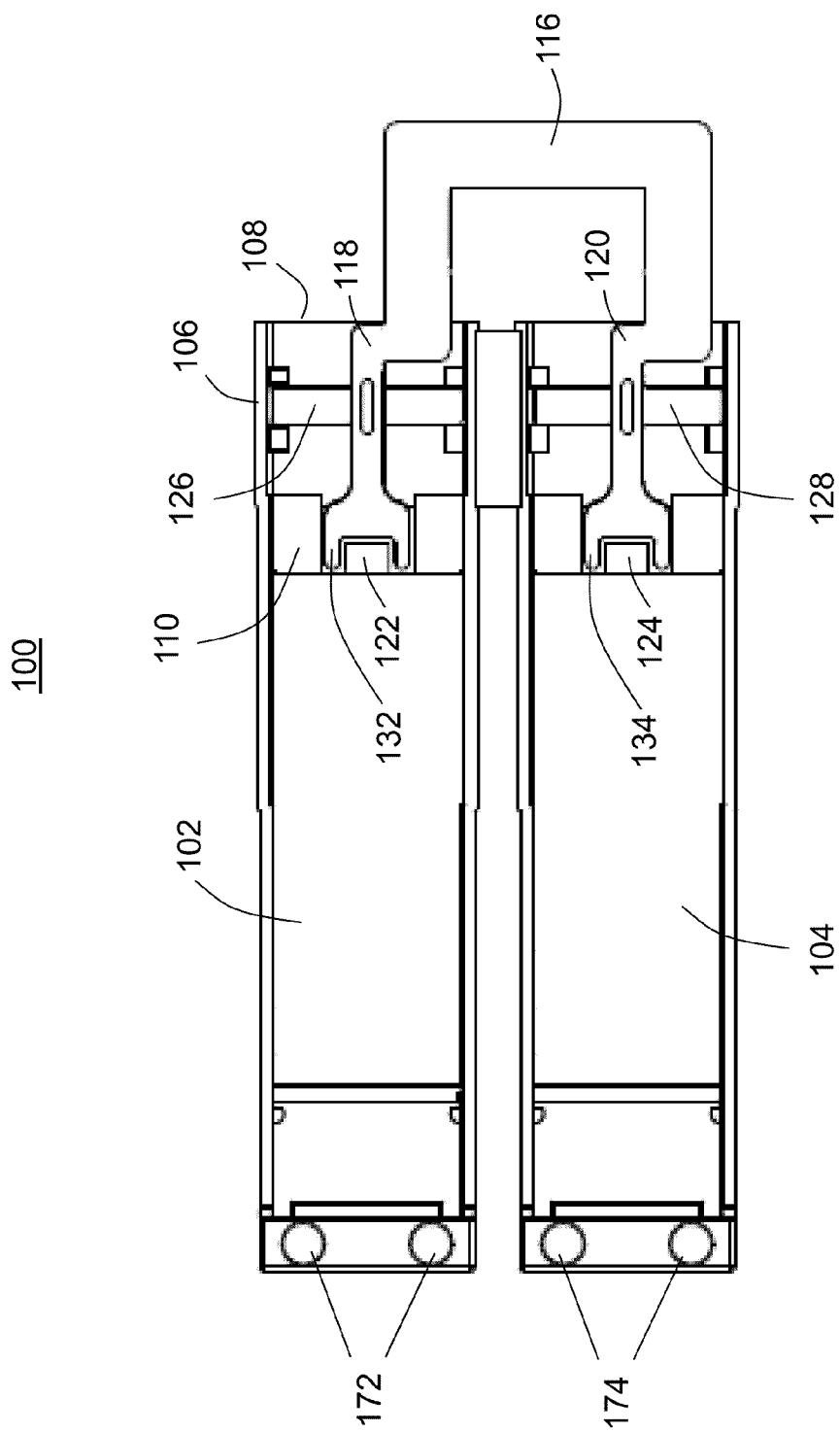
FIG. 8 is a bottom view of the multicage SFP unit of FIG. 6.
Figure 9:
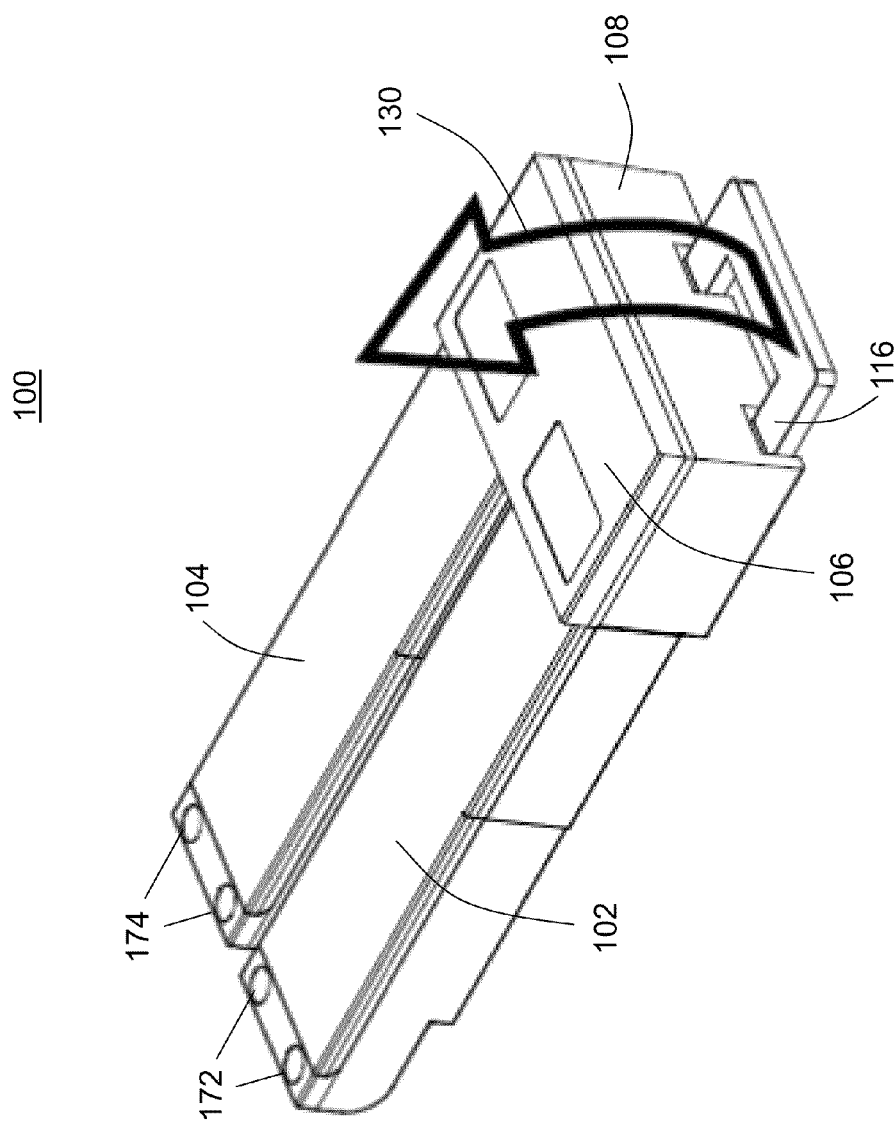
FIG. 9 shows a movement of an actuator of the multicage unit of FIG. 6.
Figure 10:
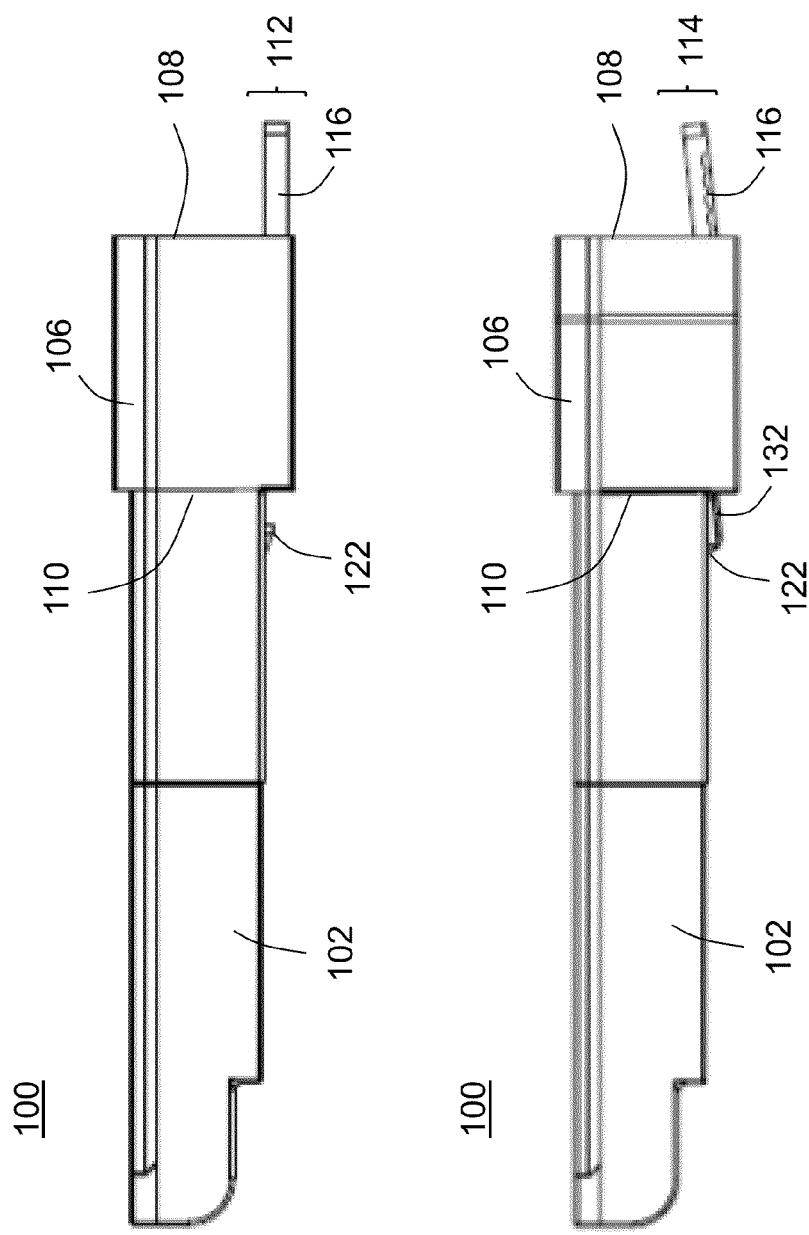
FIG. 10 shows two side elevation views of the multicage SFP unit of FIG. 6, with the actuator in a rest position (top) and in an open position (bottom)
Figure 11:
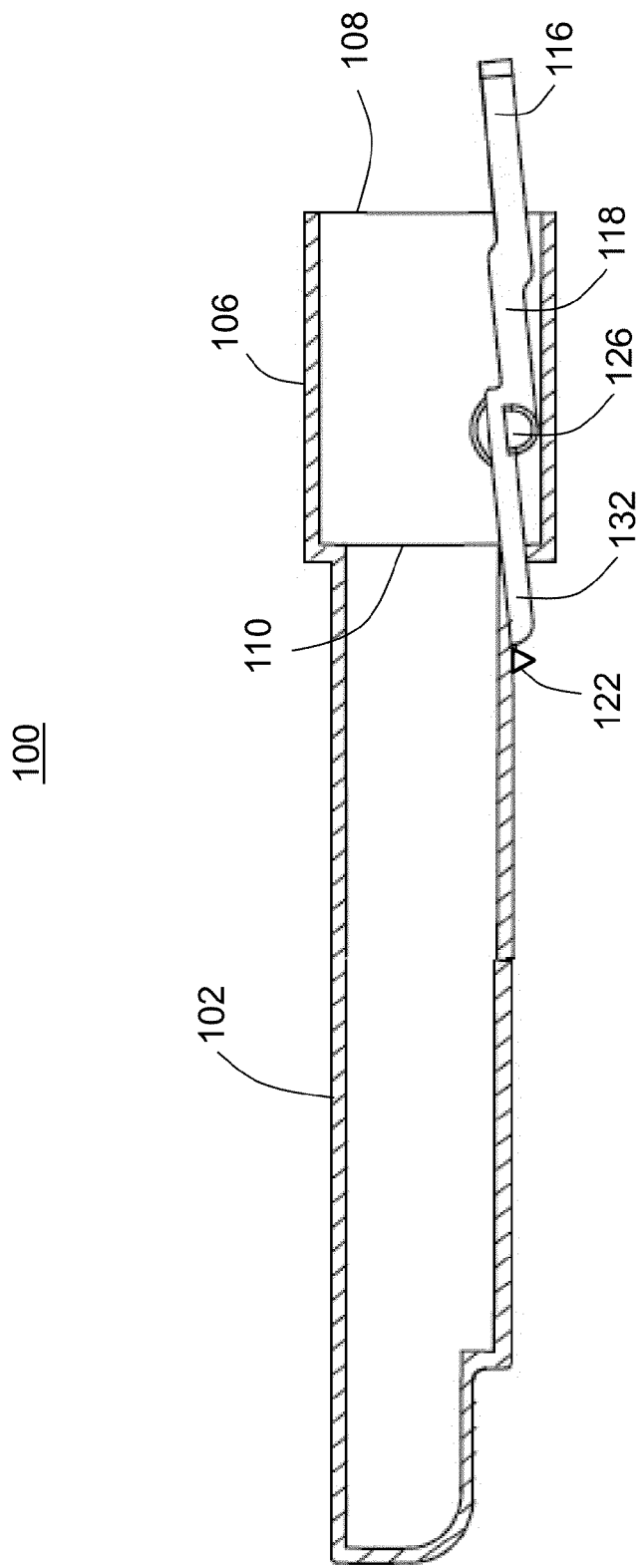
FIG. 11 is a cross-sectional, side elevation view of the multicage SFP unit of FIG. 6, with the actuator in an open position.

For illustration purposes, a multicage SFP unit comprising two cages is represented in FIGS. 6 to 11. FIG. 6 is a perspective view of the multicage SFP unit having two cages, according to an embodiment. FIG. 7 is a top plan view of the multicage SFP unit of FIG. 6. FIG. 8 is a bottom view of the multicage SFP unit of FIG. 6. FIG. 9 shows a movement of an actuator of the multicage SFP unit of FIG. 6. FIG. 10 shows two side elevation views of the multicage SFP unit of FIG. 6, with the actuator in a rest position (top) and in an open position (bottom). FIG. 11 is a cross-sectional, side elevation view of the multicage SFP unit of FIG. 6, with the actuator in an open position.

Considering at once FIGS. 6-11, a multicage SFP unit 100 is shown. The multicage SFP unit 100 comprises two (2) cages 102 and 104, arranged in a horizontal row; only one cage 102 is visible on the side elevation views of FIGS. 10 and 11. The cages 102 and 104 are attached to a single front portion 106 having a front panel 108 and a rearward side 110.

In a first variant of the multicage SFP unit 100, a distance 144 between the cages 102 and 104 may be fixed. In another variant, the distance 144 may be variable, in order to allow insertion of the cages 102 and 104 in a variety of different chassis. In a non-limiting example, the cage 102 may be in a fixed position in relation to the front panel 108, while the cage 104 may be slidably attached to the front panel 108 in order to modify distances between the two cages.

Engagement/Ejection of a Multicage SFP Unit

In an embodiment of an engagement/ejection mechanism, the multicage SFP unit comprises latches positioned underneath each one of the plurality of cages for maintaining the plurality of cages within a chassis, levers adjacent to each of the latches, and an actuator emerging from the front portion and operably connected to the levers. Upon upward movement of the actuator, the latches apply pressure underneath the plurality of cages, thereby disengaging the plurality of cages from the chassis.

Considering at once FIGS. 6-11, the engagement/ejection mechanism is shown. Two latches 122 and 124 positioned underneath the cages 102 and 104 connect with spring loaded retaining means (not shown) of the chassis in order to maintain the multicage SFP unit 100 in place when mounted on the chassis.

An actuator 116 emerges from the front panel 108 and is positioned for easy manipulation by a user. The actuator 116 has extensions 118 and 120 that may actuate two levers 132 and 134, adjacent to the latches 122 and 124, by tilting over pivots 126 and 128 when a user moves the actuator 116 upward, as indicated by arrow 130 on FIG. 9. Upon moving the actuator 116 upward from a rest position 112, best viewed at the top of FIG. 10, to an open position 114, best viewed at the bottom of FIG. 10, the levers 132 and 134 protrude from the cages 102 and 104, applying pressure to displace the spring loaded retaining means of the chassis in order to disengage the latches 122 and 124 from the spring loaded retaining means and to allow easily pulling of the multicage SFP unit 100 from the chassis. Of course, other mechanisms may be used to facilitate maintaining the multicage SFP unit 100 in the chassis and to facilitate its eventual ejection.

In an alternative embodiment of the engagement/ejection mechanism, a single latch and a single lever adjacent to the latch may be used. In this embodiment, the multicage SFP unit comprises a latch positioned underneath a fixed one of the plurality of cages for maintaining the plurality of cages within a chassis, a lever adjacent to the latch, and an actuator emerging from the front portion and operably connected to the lever. Upon upward movement of the actuator, the latch applies pressure underneath the fixed cage, thereby disengaging the plurality of cages from the chassis.

With respect to FIG. 8, this alternative embodiment of the engagement/ejection mechanism may be implemented by having the latch 122, the lever 132, the extension 118, the pivot 126, and the actuator 116 present; while the latch 124, the lever 134, the extension 120, and the pivot 128 are absent. This embodiment accommodates a variant of the multicage SFP unit 100 illustrated before, where the cage 102 may be in a fixed position in relation to the front panel 108, while the cage 104 may be slidably attached to the front panel 108 in order to modify distances between the two cages.

In still another embodiment, considering a multicage SFP unit comprising N cages, the aforementioned engagement/ejection mechanism may comprise a number n of latches positioned underneath a number n of cages, and a number n of levers adjacent to the latches; where n is greater than 1 and lower than N. A single actuator is operably connected to the n levers. Upon upward movement of the actuator, the n latches apply pressure underneath the n cages, thereby disengaging the N cages from the chassis. The n cages with the latches and levers may be any of the N cages. This embodiment may accommodate specific configurations of a multicage SFP unit, and will be illustrated later in the description, with respect to a multicage SFP unit comprising 4 cages.

Connectors and Processing Modules of a Multicage SFP Unit

A multicage SFP unit further comprises at least one connector consisting of one of: an external connector mounted to the front panel of the front portion, or ear connector mounted on one of the cages, at an opposite end from the front portion, and capable of connecting to a backplane.

In one embodiment, the at least one connector consists in at least one external connector mounted to a front panel of the front portion. Thus, the multicage SFP unit has one or more external connectors. The size of the external connector(s) and their respective position(s) on the front panel may vary.

Additionally, the multicage SFP unit may further comprise at least one rear connector mounted on at least one of the cages, at an opposite end from the front portion, and capable of connecting to a backplane. Thus, the multicage SFP unit has one or more external connectors, and one or more rear connectors. The rear connectors may be mounted on the same cage, or on different cages. A single cage may include one or more rear connectors.

Alternatively, the multicage SFP unit may further comprise at least one processing module in at least one of the cages. Thus, the multicage SFP unit has one or more external connectors, and one or more processing modules. The processing modules may be located in the same cage, or in different cages. A single cage may contain one or more processing modules.

In still another alternative, the multicage SFP unit may further comprise at least one rear connector mounted on at least one of the cages, at an opposite end from the front portion, and capable of connecting to a backplane. And the multicage SFP unit may also further comprise at least one processing module in at least one of the cages. Thus, the multicage SFP unit has one or more external connectors, one or more rear connectors, and one or more processing modules.

In another embodiment, the at least one connector consists in at least one rear connector mounted on at least one of the cages, at an opposite end from the front portion, and capable of connecting to a backplane. Thus, the multicage SFP unit has one or more rear connectors. The rear connectors may be mounted on the same cage, or on different cages. A single cage may include one or more rear connectors.

Additionally, the multicage SFP unit may further comprise at least one processing module in at least one of the cages. Thus, the multicage SFP unit has one or more rear connectors, and one or more processing modules. The processing modules may be located in the same cage, or in different cages. A single cage may contain one or more processing modules.

With respect to FIGS. 6-11, the multicage SFP unit 100 is shown without external connectors, for simplification purposes. For illustration purposes, the cages 102 and 104 each have a set of two rear connectors 172 and 174, at an opposite end from the front portion 106, for connection to a backplane (not shown) when inserted in a chassis (not shown). The two rear connectors 172 and 174 of each cage 102 and 104 are aligned horizontally for illustration purposes. They may also be aligned vertically. The configuration of the rear connectors for each cage is dependent on the configuration of the backplane to which they are connected.

Figure 12:
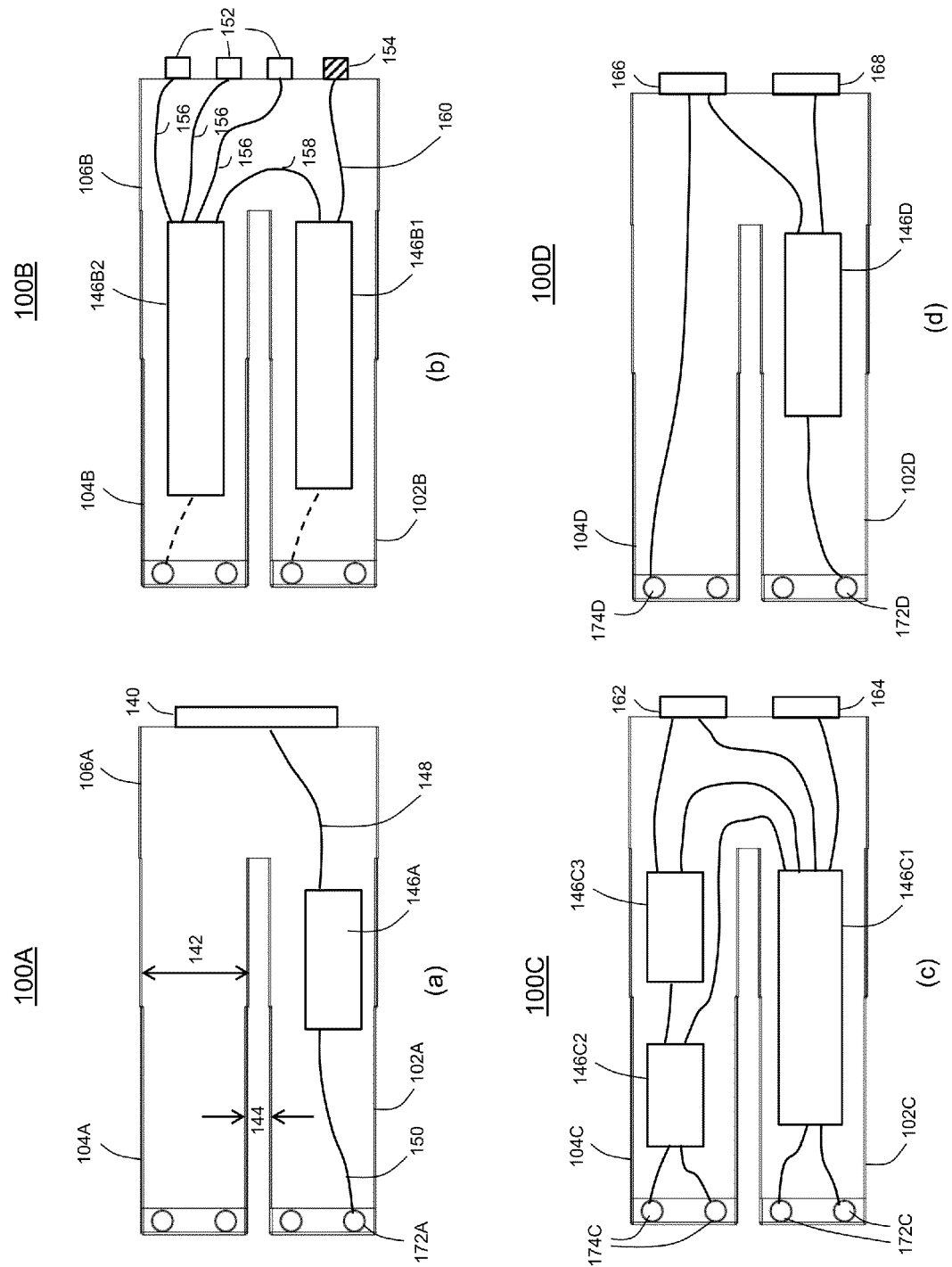
FIG. 12 is a top plan, cutaway view of the multicage SFP unit of FIG. 6, showing various configuration examples for connecting connectors and processing modules.
Figure 12:
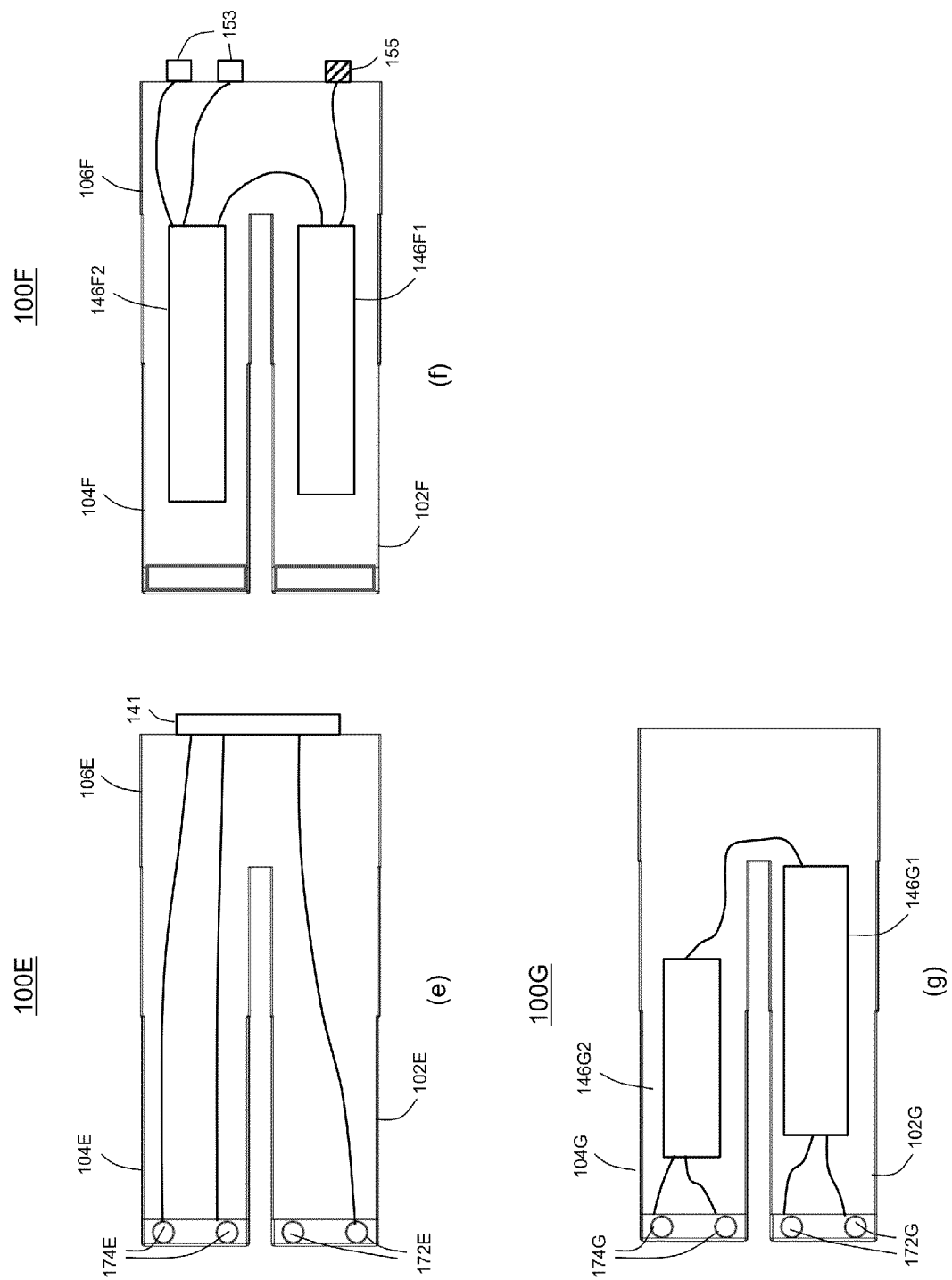

FIG. 12 is a top plan, cutaway view of the multicage SFP unit of FIG. 6, showing various configuration examples for connecting connectors and processing modules.

An external connector mounted to the front panel may be connected to an element selected from the group consisting of: another external connector mounted to the front panel, a processing module in one of the cages, a rear connector mounted on a given one of the cages, and a combination thereof.

A rear connector mounted on a given one of the cages may be connected to an element selected from the group consisting of: another rear connector mounted on the same given one cage or on another cage, a processing module in one of the cages, an external connector mounted to the front panel, and a combination thereof.

An internal connection of two processing modules located in two distinct cages passes through the front portion of the multicage SFP unit.

FIG. 12 shows contours of the multicage SFP unit 100, without the actuator 116, with seven (7) distinct configuration examples.

Examples (a) to (d) illustrate a configuration of a multicage SFP unit having one or more external connectors, one or more rear connectors, and one or more processing modules.

Example (e) illustrates a configuration of a multicage SFP unit having one or more external connectors, one or more rear connectors, but no processing module.

Example (f) illustrates a configuration of a multicage SFP unit having one or more external connectors, one or more processing modules, but no rear connectors.

Example (g) illustrates a configuration of a multicage SFP unit having one or more rear connectors, one or more processing modules, but no external connectors.

In example (a), a multicage SFP unit 100A comprises a single external connector 140. A processing module 146A, mounted in the cage 102A. The processing module 146A is connected to the single external connector 140 via an internal link 148 and to a rear connector 172A via an internal link 150. Of course, internal links may all be either unidirectional or bidirectional and capable of supporting data transmission or signal transmission. A front portion 106A of the multicage SFP unit 100A has a width allowing attachment of two cages 102A and 104A. Consequently, the external connector 140 may be wider than a width 142 of one of the cages 102A or 102B plus a distance 144 between these two adjacent cages 102A and 104A. The distance 144 may be fixed, or variable, in order to allow insertion of the cages 102A and 104A in a variety of different chassis. Additionally, the front portion 106A may have an opening larger than a width of one of the cages 102 or 104, in order to receive an external connector 140 with the aforementioned width.

In example (b), a multicage SFP unit 1008 comprises three external connectors 152 of a first type and an additional external connector 154, of a second type. A processing module 146B1 is mounted in a cage 102B while a processing module 146B2 is mounted in a cage 104B. The processing module 146B2 has internal connections 156 to the three external connectors 152 and an additional internal connection 158 to the processing module 146B1. The processing module 146B1 also has an internal connection 160 to the external connector 154. It may be observed that the internal connection 158 connects the processing modules 146B1 and 146B2 by passing through a front section 106B. Also, a width of the front section 106B allows connecting the processing module 146B2, mounted in the cage 104B, to one of the external connectors 152 that is physically located in front of the cage 102B. In the example (b), none of the external connectors and none of the processing modules have any connection with any rear connector. Although not shown, a variant of example (b) may further comprise supplemental internal connections between any component and rear connectors. For example, voltage from a backplane may provide power to the processing modules.

In example (c), a multicage SFP unit 100C comprises two external connectors 162 and 164, which may be similar or of entirely distinct types. A processing module 146C1 is mounted in a cage 102C while processing modules 146C2 and 146C3 are mounted in a cage 104C. The processing module 146C1 is connected to rear connectors 172C, to both external connectors 162 and 164, and to each of the processing modules 146C2 and 146C3. The processing module 146C2 is also connected to rear connectors 174C and to the processing module 146C3. The processing module 146C3 is also connected to the external connector 162. Although the processing modules 146C2 and 146C3 are represented in a serial configuration, alternative configurations may include processing modules in a parallel configuration located in the same cage.

In example (d), a multicage SFP unit 100D comprises two external connectors 166 and 168, which may be similar or of entirely distinct types. A processing module 146D, mounted in a cage 102D, is connected to both external connectors 166 and 168 as well as to a rear connector 172D. The external connector 166 is also connected to a rear connector 174D at the back of a cage 104D.

In example (e), a multicage SFP unit 100E comprises a single external connector 141. The multicage SFP unit 100E comprises two rear connectors 172E and 174E mounted on each of two cages 102E and 104E respectively. The multicage SFP unit 100E does not include any processing module. The single external connector 141 is connected via a first internal link to a rear connector 172E of cage 102E, and via a second internal link to a rear connector 174E of cage 104E.

In example (f), a multicage SFP unit 100F comprises two external connectors 153 of a first type, and an additional external connector 155, of a second type. A processing module 146F1 is mounted in a cage 102F while a processing module 146F2 is mounted in a cage 104F. The multicage SFP unit 100F does not include any rear connector. The processing module 146F2 has internal connections to the two external connectors 153 and an additional internal connection to the processing module 146F1. The processing module 146F1 also has an internal connection to the external connector 155.

In example (g), a multicage SFP unit 100G comprises two rear connectors 172G and 174G mounted on each of two cages 102G and 104G respectively. A processing module 146G1 is mounted in the cage 102G while a processing modules 146G2 is mounted in the cage 104G. The multicage SFP unit 100G does not include any external connector The processing module 146G1 is connected via two internal connections to the two rear connectors 172G of cage 102G, and via an internal connection to the processing module 146G2. The processing module 146G2 is also connected via two internal connections to the two rear connectors 174G of cage 104G.

Examples (a) to (g) of FIG. 12 only show a small subset of numerous possible configurations. Those of ordinary skill in the art having the benefit of the present disclosure will be able to develop other configurations.

Examples of connectors in the context of the present disclosure comprise electrical connector, audio connectors, video connectors, radiofrequency connectors, optical connectors, universal serial bus (USB) connectors, all types of coaxial cable connectors, all types of fiber optic connectors, 8P8C connectors, and internet connectors. Additionally, a connector may be capable of one of: receiving data or signals, outputting data or signals, and both receiving and outputting data or signals Examples of Processing Module Functionalities A processing module may implement various functionalities, including for example data processing, signal processing, signal buffering, signal reclocking, etc.

Signal processing may consist in one or several of the following tasks: separating or combining received signals (e.g. digital or analog video signal), calculating from received multiple signals differential outputting signals, receiving differential input signals and creating multiple outputs therefrom (e.g. multiple coaxial outputs), reshaping and/or reconditioning received signals so as to improve jitter or any other quality parameter of the received signals, equalizing received signals, transforming received signals, driving received signals, etc.

A processing module may also implement monitoring and diagnostic functionalities, to monitor signals received by the multicage SFP unit and/or processed signals generated internally by the multicage SFP unit, and to further generate a status signal and/or a diagnostic. For example, analyzing a received signal and/or a processed signal may consist in one of: analysing an audio quality parameter of the received/processed signal, analysing a video quality parameter of the received/processed signal, analysing a digital quality parameter of a content of the received/processed signal, and analysing an integrity parameter of a content of the received/processed signal.

In the case of data processing, the data may be organized in different layers, like in the Open Systems Interconnection (OSI) model. The layers generally include transport layers and applicative layers. The transport layers are generally responsible for the appropriate delivery of the information contained in the applicative layers. A processing module may operate on one or several transport layers, for example to take routing decisions, to monitor transport parameters, to perform transport level encryption, to apply a quality of service, etc. A processing module may also operate on one or several applicative layers, for example to perform applicative level encryption, to verify the integrity of the transported information, to directly process some of the transported information, etc. A single cage SFP unit may no be capable of performing some of these tasks, since their complexity requires a processing power than would not be provided by the processing module(s) of a single cage SFP. Thus, the use of a multicage SFP unit allows the deployment of the required number of processing modules in several cages of the multicage SFP unit.

In one particular configuration, some processing functionalities that are usually implemented in a chassis may be delegated to a multicage SFP unit connected to the chassis, and comprising multiple processing modules in several cages for implementing these functionalities. As a mater of fact, it may be more cost effective and more efficient to insert a multicage SFP unit providing the required functionalities, rather than upgrading an existing chassis to implement the required functionalities. In this case, the multicage SFP unit may include only rear connectors and processing modules, as illustrated in FIG. 12 (g).

In another configuration, a chassis may only be used as a support for a multicage SFP unit, and may therefore not include rear connectors. In this configuration, several processing modules located in several cages implement complex signals or data processing functionalities, to process signals or data received/transmitted by one or several external connectors, as illustrated in FIG. 12 (f).

In addition to signals and data processing modules, a multicage SFP unit may further comprise receivers, transmitters and/or transceivers (not represented in FIGS. 6 to 12 for simplification purposes); as it is the case for a single cage SFP unit. Thus, each external or rear connector of a multicage cage SFP unit may also be connected to a receiver, a transmitter, a transceiver.

Multicage SFP Unit with Four Cages

Figure 13:
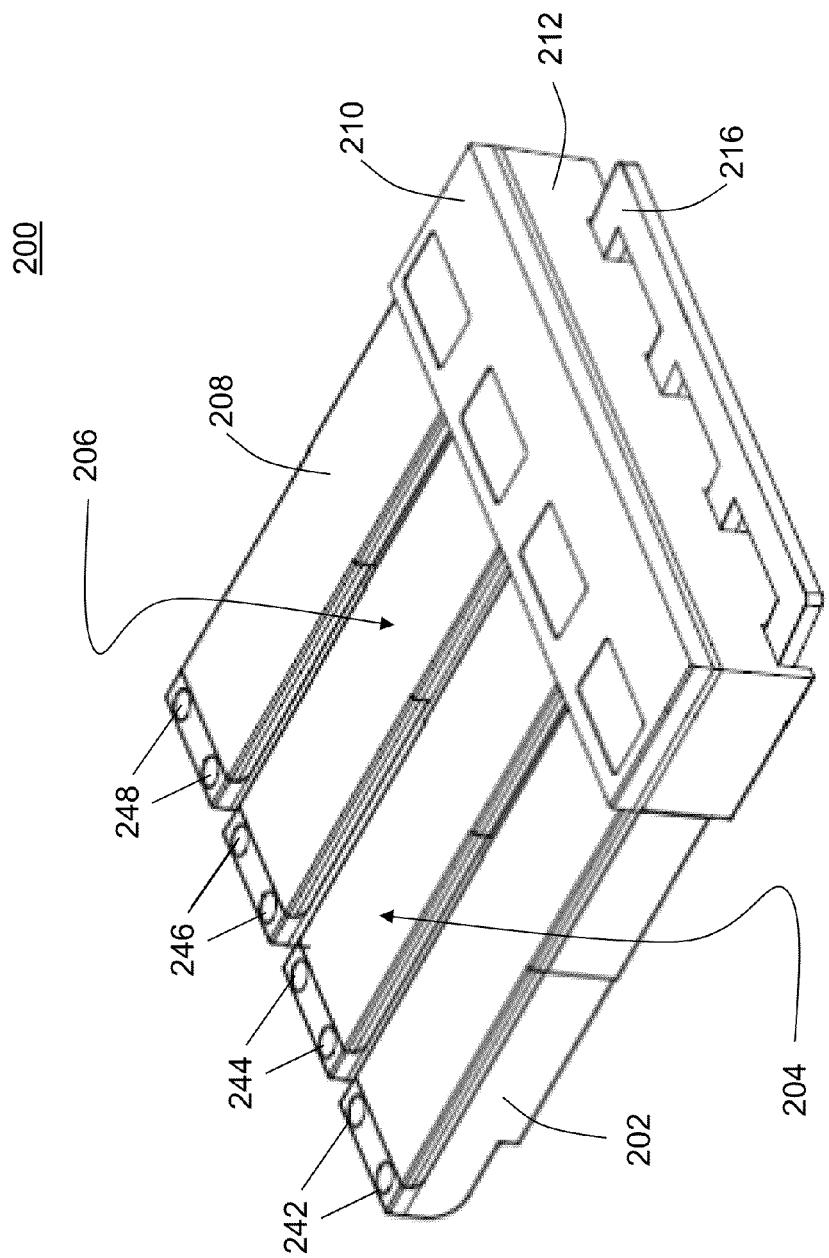
FIG. 13 is a perspective view of a multicage SFP unit having four cages, according to another embodiment.
Figure 14:
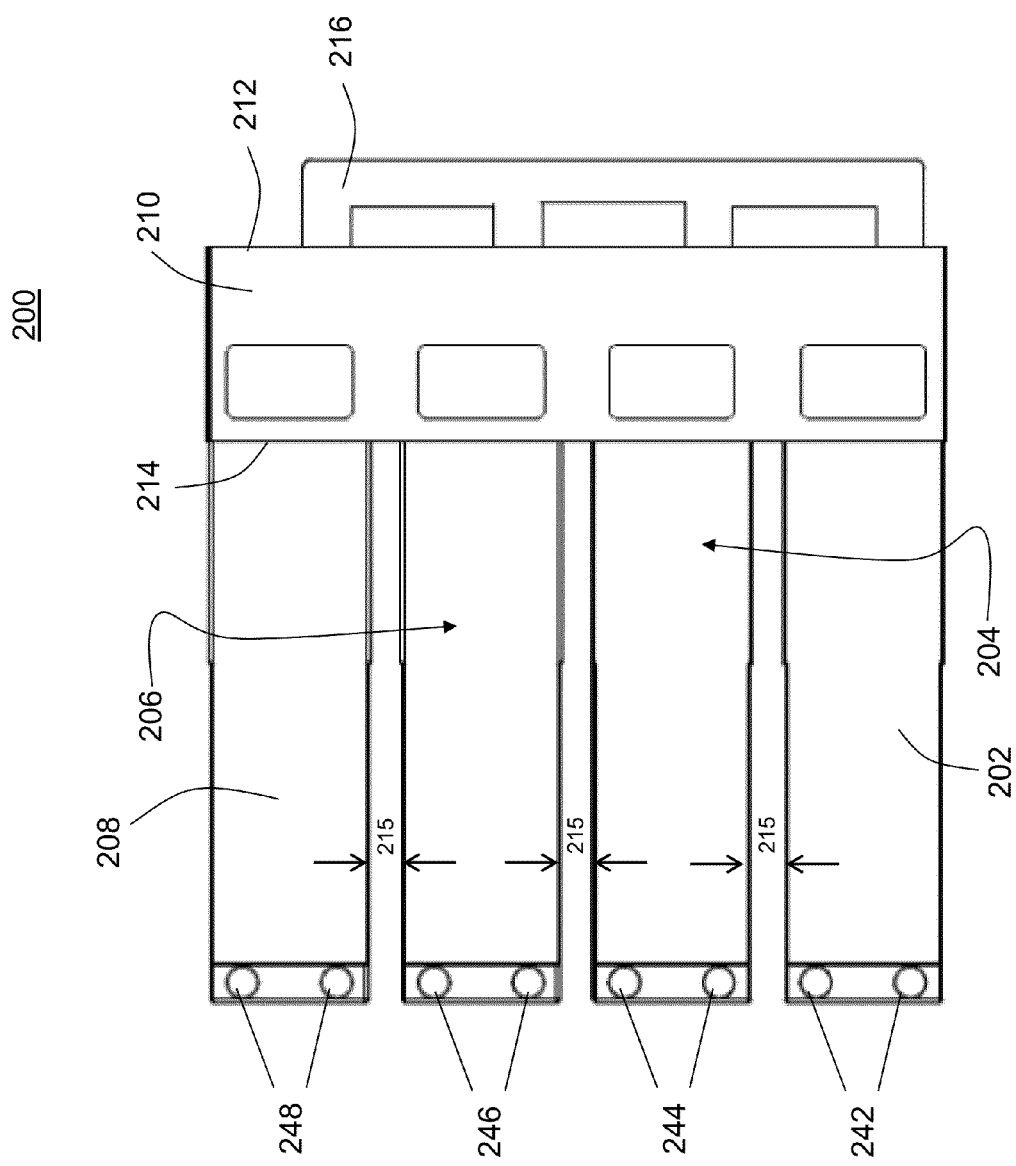
FIG. 14 is a top plan view of the multicage SFP unit of FIG. 13.
Figure 15:
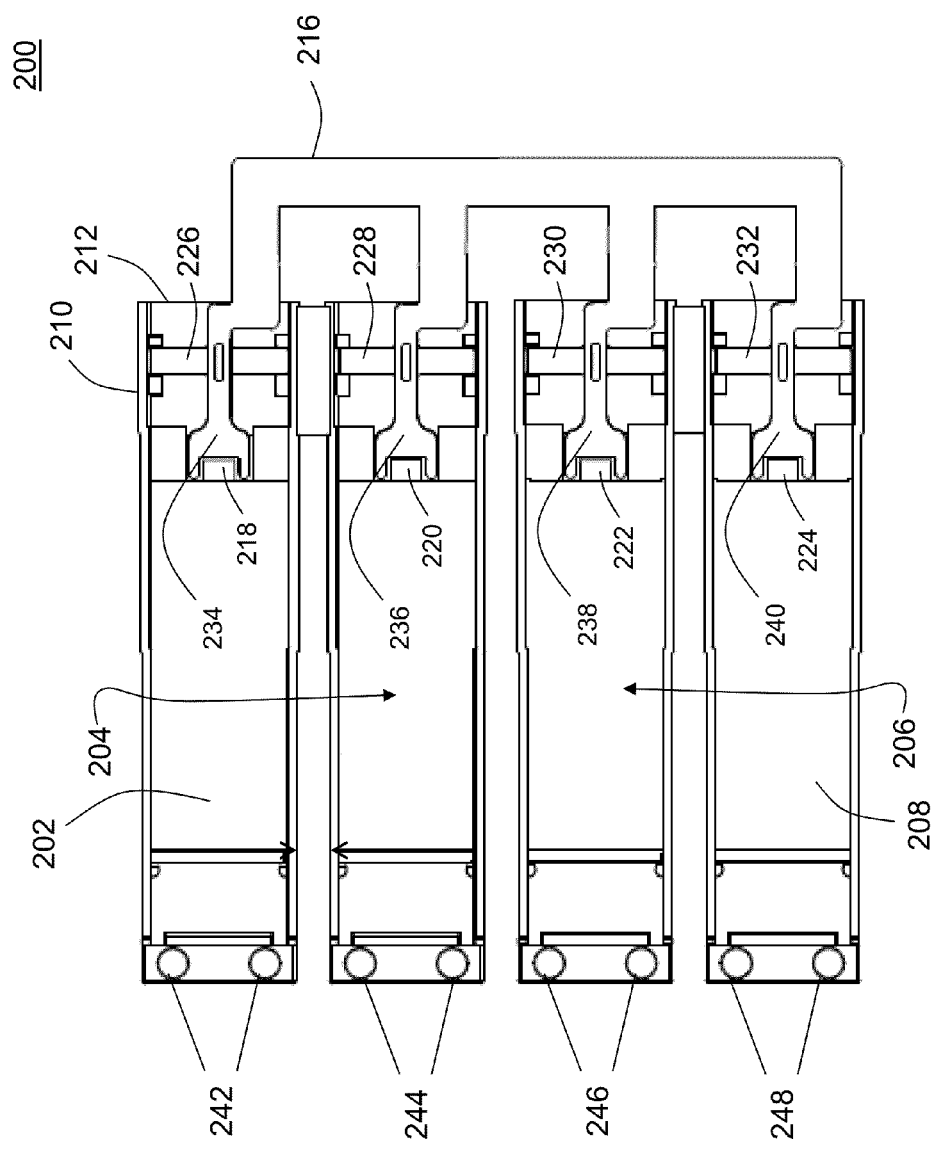
FIG. 15 is a bottom view of the multicage SFP unit of FIG. 13.
Figure 16:
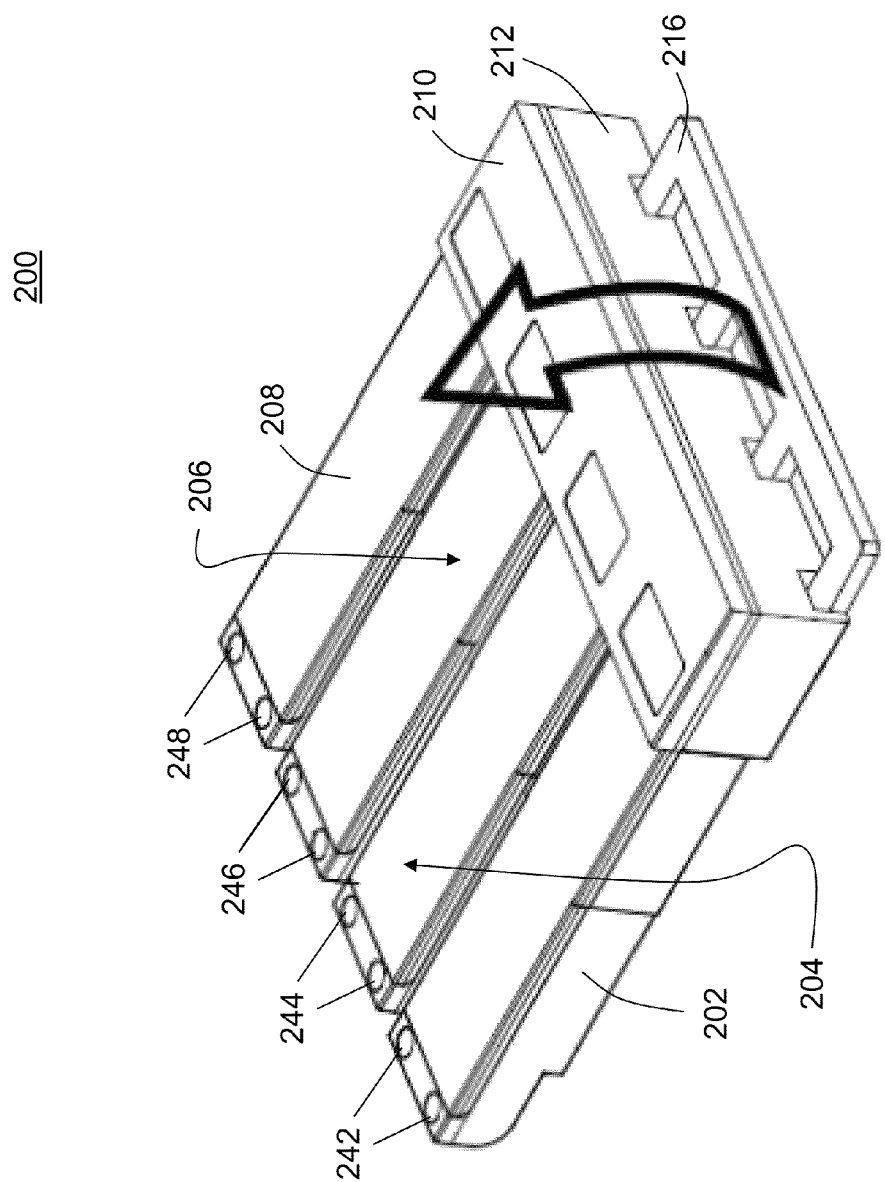
FIG. 16 shows a movement of an actuator of the multicage SFP unit of FIG. 13.
Figure 17:
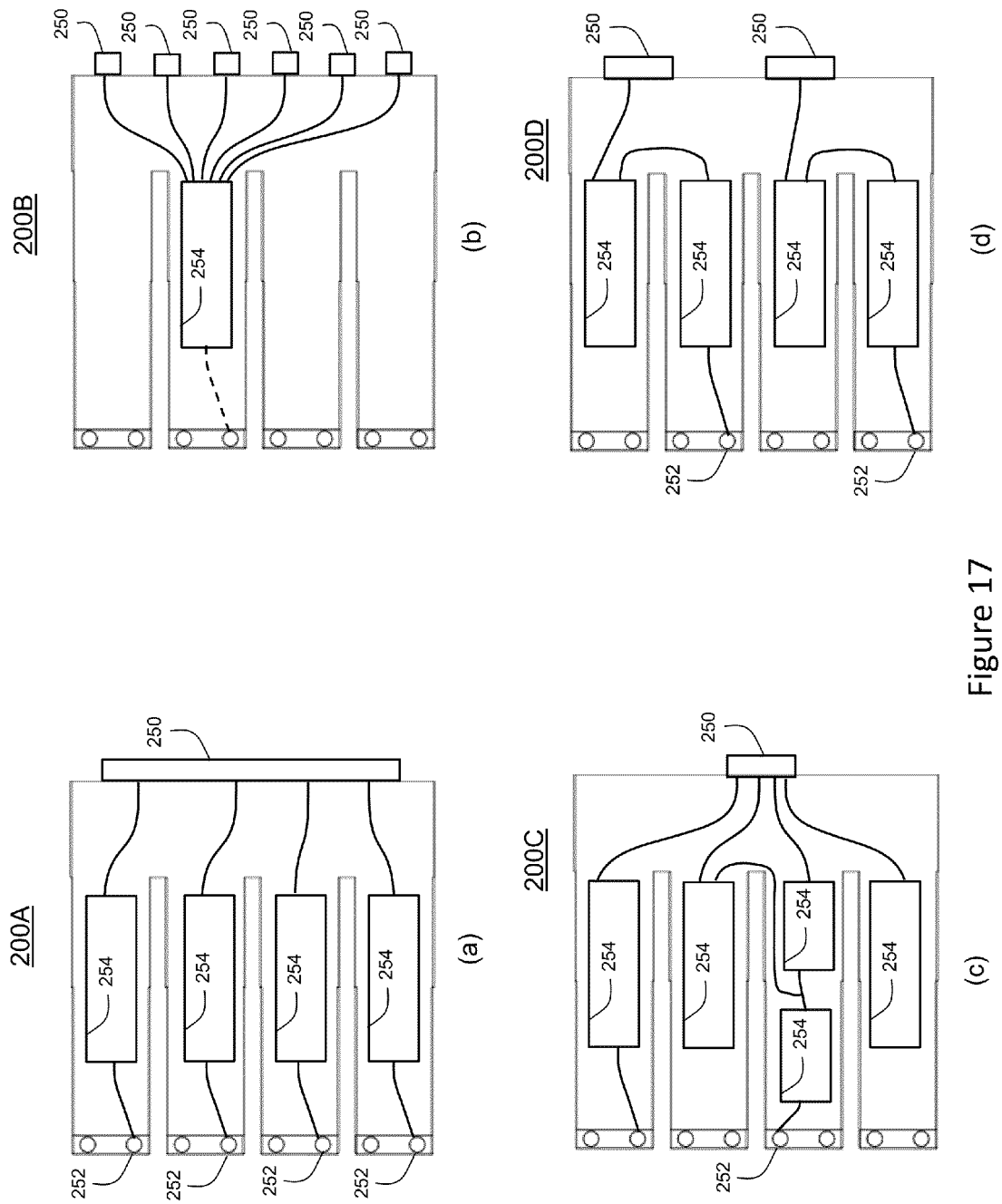
FIG. 17 is a top plan, cutaway view of the multicage SFP unit of FIG. 13, showing various configuration examples for connecting connectors and processing modules.
Figure 17:
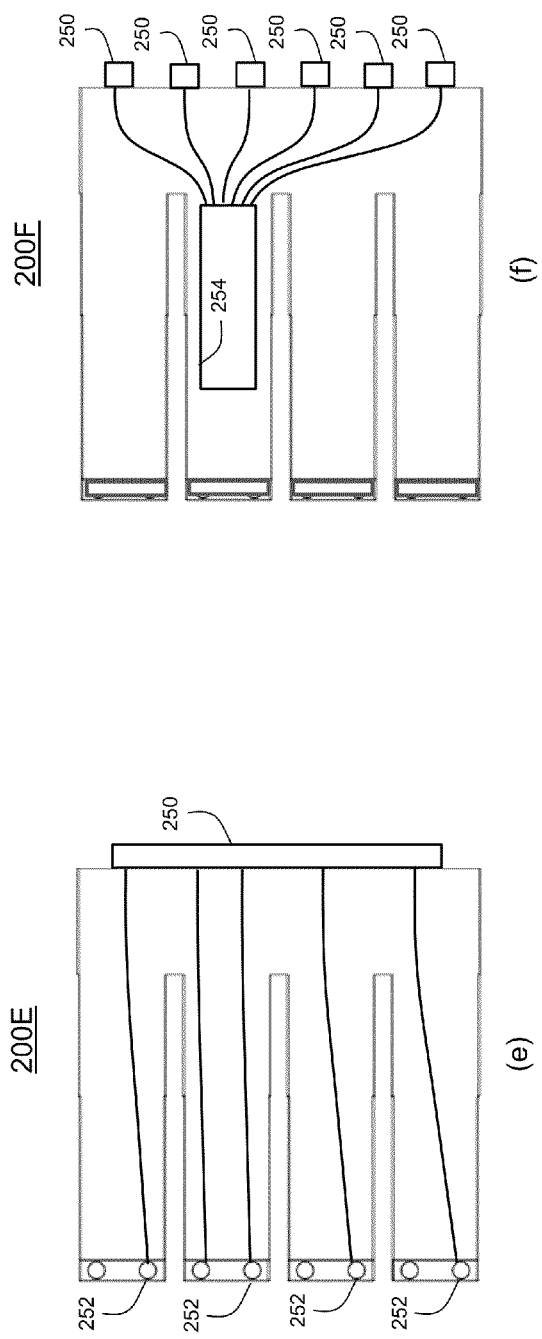

While the multicage SFP unit of FIG. 6, also viewed in FIGS. 7-12, comprises two (2) cages, other embodiments of the multicage SFP unit disclosed herein may comprise additional cages, for example three (3) or four (4) cages. FIGS. 13-17 illustrate a four-cage embodiment. Specifically, FIG. 13 is a perspective view of a multicage SFP unit having four cages, according to another embodiment, FIG. 14 is a top plan view of the multicage SFP unit of FIG. 13, FIG. 15 is a bottom view of the multicage SFP unit of FIG. 13, FIG. 16 shows a movement of an actuator of the multicage unit of FIG. 13, and FIG. 17 is a top plan, cutaway view of the multicage SFP unit of FIG. 13, showing various configuration examples for connecting connectors and processing modules. It may be observed that a side elevation view of the multicage SFP unit of FIG. 13 would be essentially identical to the views of FIGS. 10 and 11. FIGS. 13-16 illustrate a multicage SFP unit 200, shown without external connectors for simplification purposes. Comparing the embodiment of FIGS. 6-12 with the embodiment of FIGS. 13-17, the multicage SFP unit 200 comprises similar elements to those of the multicage SFP unit 100, arranged in a similar manner, including cages 202, 204, 206 and 208, a front portion 210 having a front panel 212 and a rearward side 214, an actuator 216, latches 218, 220, 222 and 224, pivots 226, 228, 230 and 232, levers 234, 236, 238 and 240 and rear connectors 242, 244, 246 and 248. Operation of the actuator 216 for releasing the multicage SFP unit 200 is functionally similar to that of the actuator 116 of the multicage SFP unit 100, the actuator 216 actuating the levers 234, 236, 238 and 240 when moved upward by a user.

In a first variant of the multicage SFP unit 200 of FIGS. 13-17, a distance 215 between the cages may be fixed. In another variant, the distance 215 may be variable, in order to allow insertion of the cages 202, 204, 206 and 208 in a variety of different chassis. In a non-limiting example, the cage 204 may be in a fixed position in relation to the front panel 212 while the cages 202, 206 and 208 may be slidably attached to the front panel 212 in order to modify distances between the various cages. In this example, the latches 218, 222 and 224, the levers 234, 238 and 240, and the pivots 226, 230 and 232 may be omitted. In this example, the actuator 216 may operate the lever 236 to release the multicage SFP unit 200 from a chassis.

In another non-limiting example, the cages 204 and 208 may be in a fixed position in relation to the front panel 212 while the cages 202 and 206 may be slidably attached to the front panel 212 in order to modify distances between the various cages. In this example, the latches 218 and 222, the levers 234 and 238, and the pivots 226 and 230 may be omitted. In this example, the actuator 216 may operate the levers 236 and 240 to release the multicage SFP unit 200 from a chassis.

As illustrated on FIG. 17, the larger number of cages of the multicage SFP unit 200 allows a wider variety of configurations of front and rear connectors and of processing modules. Examples (a), (b), (c) and (d) of multicage SFP units 200A, 200B, 200C and 200D show configurations having external connectors of various types generally represented by numeral 250, rear connectors 252, and processing modules generally represented by numeral 254. Different external connectors 250 may be mounted on a given multicage SFP unit. Additionally, different processing modules 254 may be mounted in a given multicage SFP unit. Examples (e), (f) and (g) of multicage SFP units 200E, 200F and 200G show configurations without processing modules, without rear connectors, and without external connectors, respectively. Virtually any component of a given multicage SFP unit may be connected with any other component of the same multicage SFP unit. Of course, FIG. 17 only shows a few of the numerous configuration possibilities.

Thus, the present multicage SFP unit provides a more flexible SFP configuration, which allows: use of connectors which would not efficiently fit on traditional single cage SFP units, development of more evolved processing functions as required components may not be fit into traditional single cage SFP units, avoiding additional cables and connectors, allowing expandable functions such as processing units to be changed or added as required by clients, improving ease of use for technicians installing the multicage SFP unit, and many other benefits.

Those of ordinary skill in the art will realize that the description of the multicage SFP units are illustrative only and are not intended to be in any way limiting. Other embodiments will readily suggest themselves to such persons with ordinary skill in the art having the benefit of the present disclosure. Furthermore, the disclosed multicage SFP units may be customized to offer valuable solutions to existing needs and problems of integrating components in a small form-factor.

In the interest of clarity, not all of the routine features of the implementations of the multicage SFP units are shown and described. It will, of course, be appreciated that in the development of any such actual implementation of the multicage SFP units, numerous implementation-specific decisions may need to be made in order to achieve the developer's specific goals, such as compliance with application-, system-, network- and business-related constraints, and that these specific goals will vary from one implementation to another, and from one developer to another. Moreover, it will be appreciated that a development effort might be complex and time-consuming, but would nevertheless be a routine undertaking of engineering for those of ordinary skill in the field of small form-factor pluggable units having the benefit of the present disclosure.

In accordance with the present disclosure, the components, described herein may be implemented using various types of operating systems, computing platforms, network devices, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used.

Units and modules described herein may comprise software, firmware, hardware, or any combination(s) of software, firmware, or hardware suitable for the purposes described herein.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A multicage small form-factor pluggable (SFP) unit, comprising:
    a single front portion;
    a plurality of cages attached to a rearward side of the front portion, the plurality of cages being dimensioned according to a SFP, SFP+ or XFP specification for allowing insertion of the plurality of cages into a chassis; and
    an engagement and ejection mechanism for respectively maintaining the plurality of cages within the chassis and disengaging the plurality of cages from the chassis, the engagement and ejection mechanism comprising:
        a latch positioned underneath a fixed one of the plurality of cages for maintaining the plurality of cages within a chassis;
        a lever adjacent to the latch; and
        an actuator emerging from the front portion and operably connected to the lever; and
        wherein upon upward movement of the actuator, the latch applies pressure underneath the fixed cage, thereby disengaging the plurality of cages from the chassis.

2. The multicage SFP unit of claim 1, wherein at least one cage is slidably attached to the front portion so that a distance between the slidably attached cage and a cage adjacent to the slidably attached cage is adjustable.

3. The multicage SFP unit of claim 1, wherein the front portion has an opening larger than a width of one of the cages for receiving a connector.

4. The multicage SFP unit of claim 1, wherein the engagement and ejection mechanism further comprises:
    at least one additional latch positioned underneath at least one additional cage from the plurality of cages for maintaining the plurality of cages within the chassis; and
    at least one additional lever adjacent to the at least one additional latch; and
    wherein the actuator is operably connected to the at least one additional lever;
    and upon upward movement of the actuator, the at least one additional latch applies pressure underneath the at least one additional cage, thereby disengaging the plurality of cages from the chassis.

5. The multicage SFP unit of claim 1, further comprising:
    at least one connector consisting of one of:
        an external connector mounted to a front panel of the front portion; and
        a rear connector mounted on one of the cages, at an opposite end from the front portion, and capable of connecting to a backplane.

6. The multicage SFP unit of claim 1, further comprising at least one external connector mounted to a front panel of the front portion.

7. The multicage SFP unit of claim 6, further comprising:
    at least one rear connector mounted on at least one of the cages, at an opposite end from the front portion, and capable of connecting to a backplane.

8. The multicage SFP unit of claim 7, further comprising:
    at least one processing module in at least one of the cages.

9. The multicage SFP unit of claim 6 further comprising:
    at least one processing module in at least one of the cages.

10. The multicage SFP unit of claim 6, wherein the at least one external connector is connected to an element selected from the group consisting of another external connector mounted to the front panel of the front portion, a processing module in one of the cages, a rear connector mounted on a given one of the cages at an opposite end from the front portion and capable of connecting to a backplane, and a combination thereof.

11. The multicage SFP unit of claim 1, further comprising at least one rear connector mounted on at least one of the cages, at an opposite end from the front portion, and capable of connecting to a backplane.

12. The multicage SFP unit of claim 11, further comprising:
   at least one processing module in at least one of the cages.

13. The multicage SFP unit of claim 11, wherein the at least one rear connector is connected to an element selected from the group consisting of another rear connector mounted on a given one of the cages at an opposite end from the front portion and capable of connecting to the backplane, a processing module in one of the cages, an external connector mounted to a front panel of the front portion, and a combination thereof.

14. The multicage SFP unit of claim 5, wherein a width of an external connector mounted to the front panel is larger than a width of a cage plus the distance between two adjacent cages.

15. The multicage SFP unit of claim 5, further comprising:
   two processing modules in two distinct cages; and
   an internal connection of the two processing modules, the internal connection passing through the front portion.

16. The multicage SFP unit of claim 5, wherein the at least one connector is selected from the group consisting of an electrical connector, an audio connector, a video connector, a radiofrequency connector, an optical connector, a universal serial bus connector, a coaxial connector, a fiber optic connector, an 8P8C connector, and an internet connector.

17. The multicage SFP unit of claim 1, wherein the plurality of cages is arranged in a horizontal row.

* * * * *